United States Patent [19]

Yamauchi

[11] Patent Number: 5,353,934
[45] Date of Patent: Oct. 11, 1994

[54] SUBSTRATE HOLDING CASE

[75] Inventor: Takashi Yamauchi, Tokyo, Japan

[73] Assignee: Dai Nippon Printing Co., Ltd., Japan

[21] Appl. No.: 99,927

[22] Filed: Aug. 3, 1993

[30] Foreign Application Priority Data

Aug. 6, 1992 [JP] Japan ................... 4-229382

[51] Int. Cl.$^5$ .................................. B65D 85/30
[52] U.S. Cl. ........................ 206/454; 206/328; 206/334; 206/453; 206/586
[58] Field of Search .............. 206/449, 453, 454, 328, 206/332, 334, 455, 456, 586

[56] References Cited

U.S. PATENT DOCUMENTS

| | | | |
|---|---|---|---|
| 3,489,265 | 1/1970 | Puente | 206/454 |
| 3,532,213 | 10/1970 | Schulz | 206/454 X |
| 3,615,006 | 10/1971 | Freed | 206/454 |
| 4,077,515 | 3/1978 | Shoberg | 206/456 |
| 4,422,547 | 12/1983 | Abe et al. | 206/328 |
| 4,511,038 | 4/1985 | Miller et al. | |
| 4,589,551 | 5/1986 | Hellon | 206/456 |
| 4,752,007 | 6/1988 | Rossi et al. | 206/454 X |
| 4,776,462 | 10/1988 | Kosugi et al. | 206/334 |
| 4,830,182 | 5/1989 | Nakazato et al. | |
| 4,842,136 | 6/1989 | Nakazato et al. | 206/328 |
| 4,938,360 | 7/1990 | Wallace | 206/586 |
| 5,147,042 | 9/1992 | Levy | 206/456 |
| 5,253,755 | 10/1993 | Maenke | 206/454 X |

FOREIGN PATENT DOCUMENTS 59-74726 5/1984 Japan .
63-92788 6/1988 Japan .

Primary Examiner—Bryon P. Gehman
Attorney, Agent, or Firm—Parkhurst, Wendel & Rossi

[57] ABSTRACT

In a case for holding and carrying a substrate such as a photomask, a case body comprises a top cover and a bottom cover, whose inner surfaces include inwardly extending protrusions integrally formed therewith. The protrusions are crowned with silicone caps to hold a substrate. The substrate within the case is at its four corners fixedly held from both sides by the silicone caps. The top and bottom covers also include at their inner surfaces a plurality of positioning projections designed to come into contact with the edges of the substrate to place the substrate in position in its surface direction. Then the top cover and the bottom cover are brought into engagement with each other and fastened together, thereby providing a case low in dust generating characteristics arising from vibration and capable of holding various sizes and thicknesses of the substrate.

25 Claims, 5 Drawing Sheets

SUBSTRATE HOLDING CASE

BACKGROUND OF THE INVENTION

1. Field of the Invention

The present invention relates generally to a substrate holding case for storing or carrying a substrate such as a photomask or a photomask blank for use in the production of semiconductor elements or liquid crystal display elements, and more particularly is directed to a substrate holding case capable of holding various types of substrates having different sizes, and specifically capable of storage or carriage of a photomask with a pellicle.

2. Description of Related Arts

Typical substrate holding cases have been hitherto disclosed in Japanese Utility Model Laid-open Publication Nos. (1) 59-74726 and (2) 63-92788. The former (1) describes a structure where a cushioning material such as silicone rubber is interposed between a mask and covers, while the latter (2) describes a structure using as a cushioning member an elastic material fitted into an inside groove of the top cover. By the provision of the cushioning member, these substrate holding cases have contrived to restrain generation of dust which may be caused by vibration of the photomask. These cases are designed to accommodate a multiplicity of photomasks, and it has been found difficult after all to entirely suppress the vibration of all the photomasks. Furthermore, the structure of the case is large and complicated, and cleaning of the case itself also entails a problem. Furthermore no measures have been made to hold various substrates having different thicknesses or sizes, either. Photomask cases for storing a single substrate are disclosed in U.S. Pat. Nos. 4,511,038 and 4,830,182. Those cases are inconveniently incapable of holding various types of photomasks having different sizes.

With the miniaturization of the photomasks in recent years, however, there has been an increasing demand for a variety of dimensions of the mask. Accordingly, the cases for holding a substrate such as a photomask are also being subjected to a demand for lowered dust generating characteristics and for a capability of holding masks of a variety of dimensions.

SUMMARY OF THE INVENTION

It is the object of the present invention under such circumstances to provide a substrate holding case which is capable of restraining generation or accumulation of dust within the case, capable of accommodating therein various thicknesses and sizes of substrate, such as a photomask and superior in cleaning and drying characteristics of the case itself.

According to the present invention, the above object can be achieved by a substrate holding case, comprising a case body including a top cover and a bottom cover; substrate holding means for holding a substrate, provided on the insides of the top cover and bottom cover so as to be brought into contact with two major surfaces of the substrate within the case from each side of the substrate; substrate positioning means for positioning the substrate, protrusively provided on the insides of the top cover and bottom cover so as to be brought into contact with edges of the substrate within the case; and fastening means for fastening the top cover and bottom cover together; the substrate holding means including a plurality of protrusions extending from the inner surfaces of the top cover and bottom cover toward the major surfaces of the substrate; and a plurality of caps removably fitted on at least some of the plurality of protrusions.

In order to restrain dust generation or accumulation due to vibration, the material of the cap may be made of silicone for the impartment of cushioning characteristics. The corners and uneven portions of the case body are desirably rounded to improve cleaning and drying characteristics. The use of BAYON (a brand name, products of Kureha Chemical Industry Co., Ltd., Japan) as the material of the case body provides antistatic properties of a substrate such as a photomask and reusability of the case body through cleaning. BAYON includes a hard resin (matrix) containing rubber particles with a low electric resistivity dispersed therein.

Furthermore, appropriate dimensioning of the top cover and bottom cover in thickness, and of the substrate holding means and substrate positioning means enables the case to be also applied to storage or delivery of the photomask with a pellicle.

It is to be noted that the shape of the substrate to be accommodated within the substrate holding case is not limited to a quadrangle. In the case of quadrangular substrate such as a photomask, the substrate holding means may be provided on the four corners of the quadrangle in a confronting manner. In the case where the substrate does not have a quadrangular shape, the holding means must be correspondingly selected in number and position. The same can be said for the substrate positioning means, that is, the position, number and size of the positioning means are preferably selected corresponding to the shape of the substrate.

In the present invention, the substrate holding means may comprise a plurality of protrusions provided on the top cover and the bottom cover and fitted with the caps, thereby simplifying the entire structure of the case, and making it possible to encase a photomask substrate with a pellicle through appropriate selection in dimensions of the top and bottom covers. The case of the present invention enables a variety of types of substrates having different configurations and dimensions to be held in place through appropriate selection of the caps in dimensions and of the protrusions to be fitted with the caps.

DESCRIPTION OF THE PREFERRED EMBODIMENTS

Embodiments of the present invention will now be described with reference to the accompanying drawings.

Figure 1:
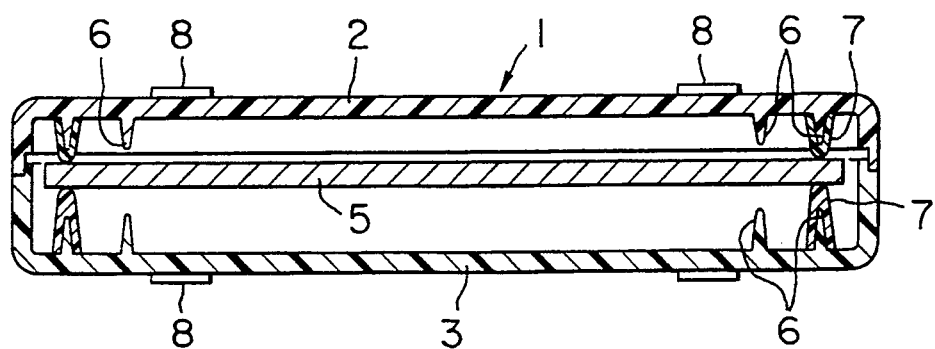
FIG. 1 is a vertical sectional view showing an embodiment of a substrate holding case in accordance with the present invention.
Figure 2:
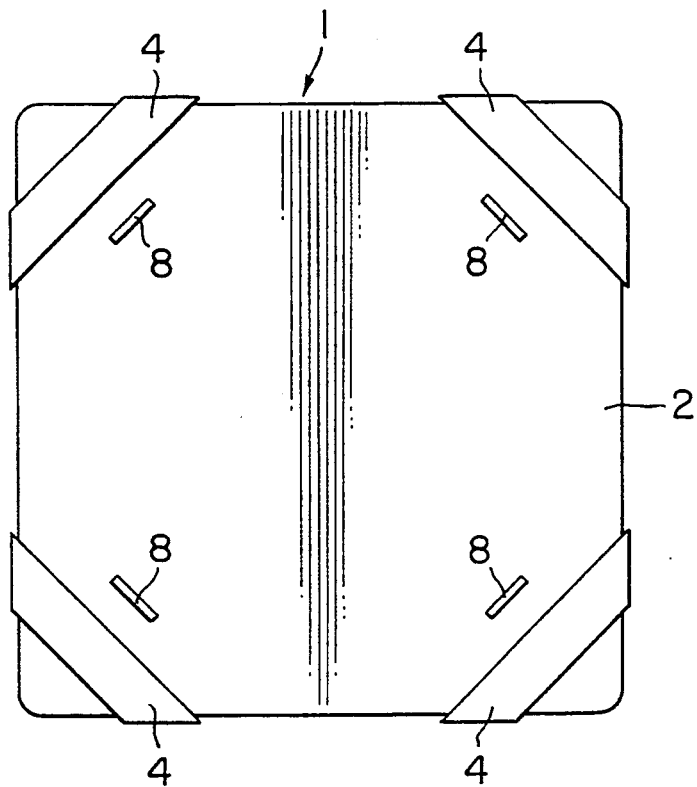
FIG. 2 is a top plan view of the substrate holding case shown in FIG. 1.
Figure 3:
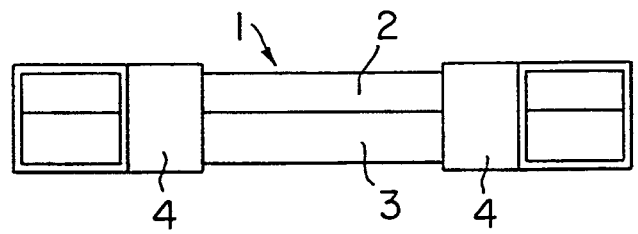
FIG. 3 is an elevational view of the substrate holding case shown in FIG. 1.
Figure 4:
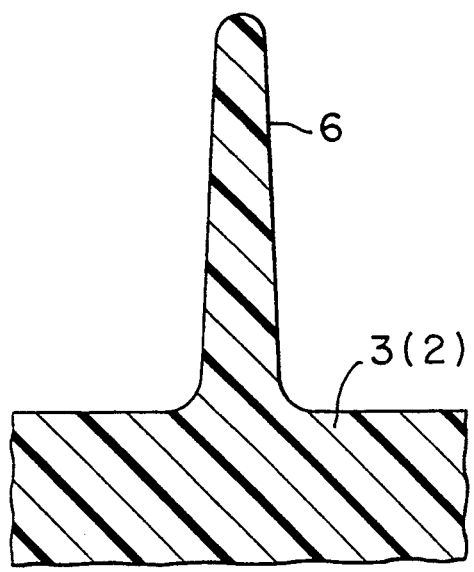
FIG. 4 is an enlarged sectional view of a protrusion provided on the substrate holding case shown in FIG. 1.
Figure 5:
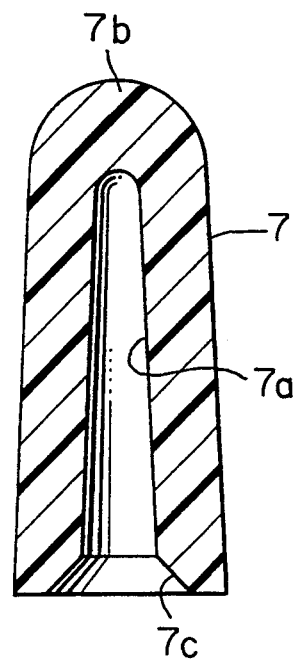
FIG. 5 is an enlarged sectional view of a cap fitted on the protrusion.

FIGS. 1 to 3 illustrate an embodiment of a substrate holding case in accordance with the present invention. This embodiment is a case for accommodating a quadrangular substrate such as a photomask. A case body generally designated at 1 comprises a quadrangular top cover 2 and bottom cover 3 which are designed to be fastened together by means of a band-like retainer 4 fitted onto four corners of the case body as shown in FIGS. 2 and 3. As is apparent from FIG. 1, the top cover 2 and bottom cover 3 include a plurality of protrusions 6 integrally formed on the inner surfaces thereof and extending toward the two major surfaces of a substrate 5 to be received within the case 1. The protrusion 6 is preferably in the shape of a tapered rod as shown in FIG. 4, and crowned with a cap 7. As shown in FIG. 5, the cap 7 includes an interior hole 7a corresponding to the configuration of the protrusion 6, and preferably has a circular section and an arcuately rounded tip 7b. In order to facilitate the capping onto the protrusion 6, the interior hole 7a has a tapered inlet 7c.

In the case of the embodiment shown in FIG. 1, the plurality of protrusions 6 are provided at different positions with respect to the directions from the center of the case 1 to the four sides of the quadrangular case body, with only outside ones of the protrusions 6 being fitted with the caps 7. The round tips of the caps 7 are caused to come into contact with one of the major surfaces of the substrate 5 in the vicinity of the edges thereof to thereby retain the substrate 5 in parallel with the inner surfaces of the top and bottom covers 2 and 3. Thus, the protrusions 6 and the caps 7 make up a substrate holding means in cooperation. The tips of the exposed protrusions 6 free from the caps 7 are short of the surface of the substrate 5. In the shown embodiment, the caps 7 below the substrate 5 are formed longer than the caps 7 above the substrate 5 so that the substrate 5 is positioned nearer the top cover 2 than the bottom cover 3. At any rate, the dimensions of the protrusions 6 and caps 7 can be arbitrarily selected in consideration of the thickness of the substrate and others.

The materials of the case body and the protrusions 6 integrally formed therewith preferably have low dust generating characteristics as well as reusability superior in cleaning and drying properties, and, for example, may be made of an electrically conductive synthetic resin. An example of such materials is a hard resin with rubber particles having a low electrical resistivity dispersed therein (which is supplied from Kureha Chemical Industry Co., Ltd. by the brand name of BAYON). The hard resin may comprise any one selected from a group consisting of butadiene, butil acrylate, methyl acrylate, and methyl methacrylate, or any combination thereof. This embodiment employs a combination of the four compounds plus an orange dye. The use of such materials for the case body and the protrusions provides an antistatic effect of the substrate. The materials of the cap 7 preferably have low dust generating characteristics and high cushioning characteristics.

Figure 6:
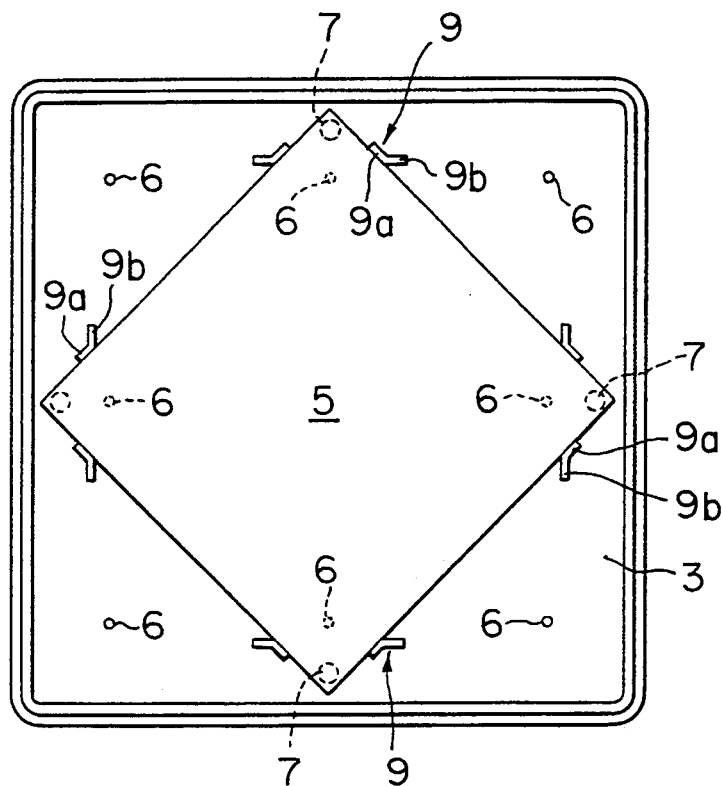
FIG. 6 is a top plan view showing a state where a substrate is positioned within a bottom cover of the substrate holding case in FIG. 1.
Figure 8:
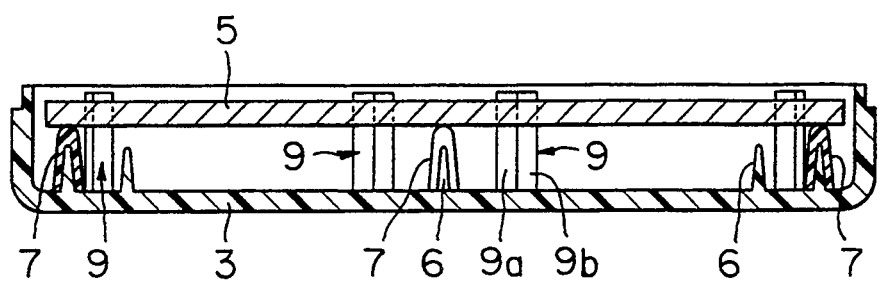
FIG. 8 is a vertical sectional view corresponding to FIG. 6.

Besides the substrate holding means for clamping a substrate, the case 1 includes a substrate positioning means which is brought into contact with the edges of the substrate to hold the substrate in position within the case. The substrate positioning means, as shown in FIGS. 6 and 8, may comprise a plurality of positioning projections 9 integrally provided on the inner surface of the bottom cover 3 and extending toward the top cover 2. As shown in FIG. 8, the projections 9 extend up to a height slightly above the upper surface of the substrate 5, and, in FIG. 6 embodiment, each include a portion 9a intended to be in contact with one of the four edges, at the four corners, of the quadrangular substrate 5 being placed within the case at the position shown. In this embodiment, each of the projections 9 includes a portion 9b being integral with the portion 9a and extending in parallel with one of the edges of the case 1 so as to present the projection 9 a generally angled shape. By virtue of such positioning projections 9, the substrate 5 is positionally restricted at its four corners to assume a predetermined position with respect to the surface direction thereof. In this embodiment, the protrusions 6 with the caps 7 are arranged between a pair of positioning projections 9 resting on both sides of each corner of the substrate 5 so as to abut against the associated corner of the substrate 5. As is also shown in FIG. 8 corresponding to FIG. 6, the projections 6 are also arranged inwardly of the caps 7 located at the four corners of the substrate, although they are not fitted with the caps 7. The projections 6 are also provided in the region toward the four corners of the case 1.

Figure 7:
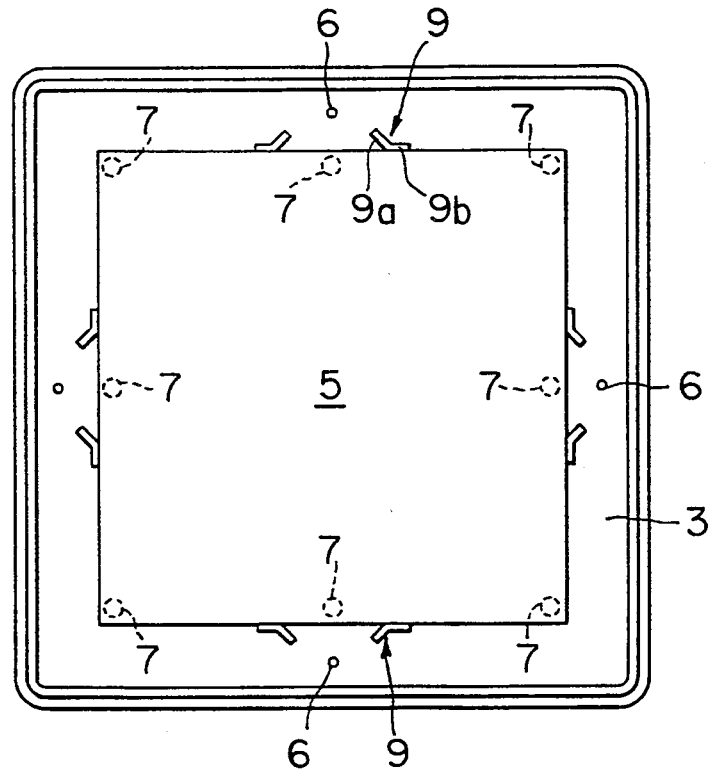
FIG. 7 is a top plan view similar to FIG. 6, showing a state where another substrate is positioned within the bottom cover.
Figure 9:
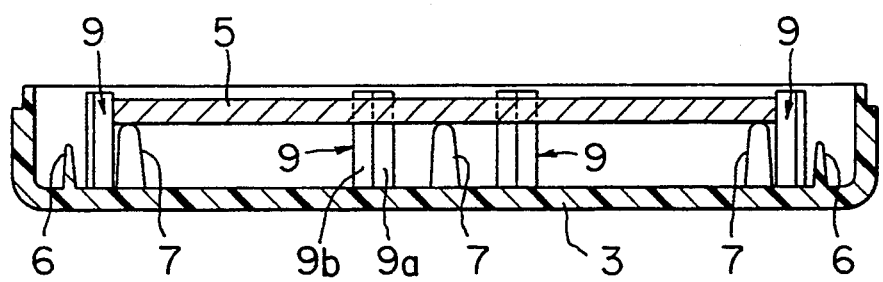
FIG. 9 is a vertical sectional view corresponding to FIG. 7.

The provision of such positioning projections 9 enables the substrate 5 to be positioned in such a manner that the four edges of the substrate 5 run in parallel with the corresponding four edges of the case 1 as shown in FIG. 7. More specifically, the substrate 5 in this embodiment is larger in size than that in FIG. 6 embodiment, and the portions 9b of the projections 9 are caused to abut in pairs against the substrate 5 for positioning thereof in the middle of each of the four side edges of the substrate 5. In this instance, as also shown in FIG. 9, the projections 6 which have not been used in FIG. 6 embodiment are fitted with the caps 7, whereas the caps 7 of the projections 6 which have been used are removed. In the case of FIG. 7, the caps 7 are abutted against the substrate 5 not only in the four corners thereof but also in the middle of each edge.

As shown in FIGS. 1 and 2, the top cover 2 and the bottom cover 3 have each at its outer surface a plurality of engagement portions 8 for stacking, adapted to engage with their counterparts when a plurality of cases are stacked up.

A procedure for fixedly accommodating a substrate 5 within the case 1 of the above-described embodiments comprises the steps of: placing the substrate 5 in the bottom cover 3 of the case 1 with the top cover 2 being removed; positioning the substrate 5 in its surface direction with the aid of the positioning projections 9 as shown in FIG. 6 or 7; supporting the substrate on the caps 7 which are fitted on the protrusions 6 on the bottom cover 3 and which lie within the range of the substrate surface; engaging the top cover 2 with the bottom cover 3 so that the tips of the caps 7 fitted on the protrusions 6 downwardly extending from the inner surface of the top cover 2 are abutted against the upper surface of the substrate, to consequently clamp the substrate by the tips of the upper and lower caps 7; and fastening the top and bottom covers together as shown in FIGS. 2 and 3.

Figure 10:
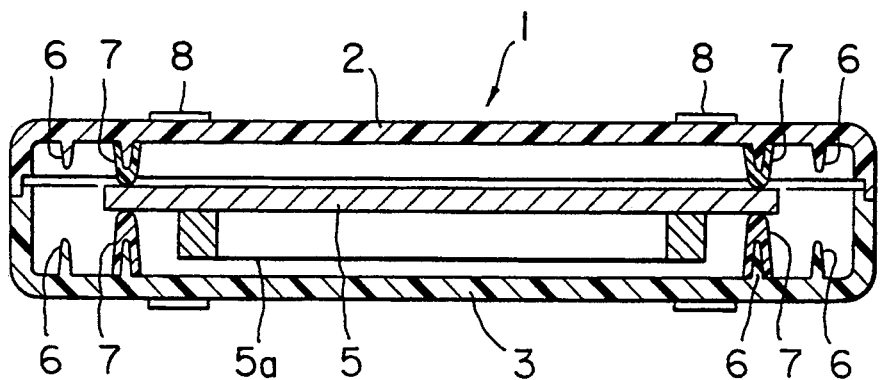
FIG. 10 is a vertical sectional view showing another embodiment of the substrate holding case in accordance with the present invention.

FIG. 10 depicts a further embodiment of a case for accommodating a photomask substrate 5 with a pellicle 5a. In this embodiment, the bottom cover 3 has a large depth, and the caps 7 to be mounted on the protrusions provided on the bottom cover 3 are fashioned to have a large length, thus defining a deep space for receiving the pellicle 5a of the substrate 5 within the interior of the bottom cover 3. In this instance as well, two sets of protrusions 6 are provided so as to be capable of accommodating two kinds of substrate sizes.

Figure 11:
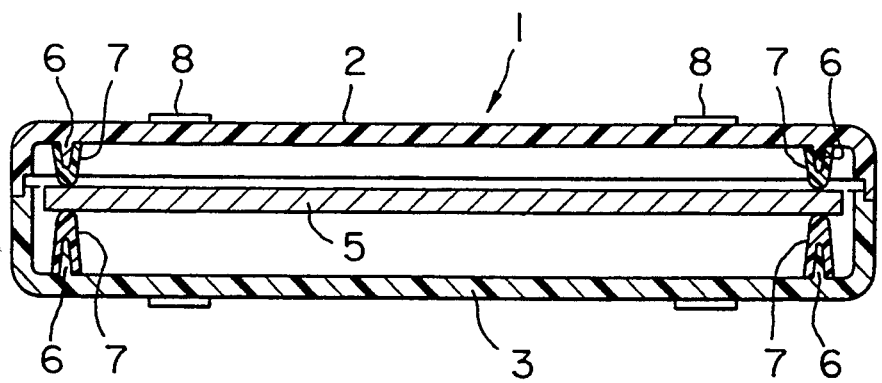
FIG. 11 is a vertical sectional view showing a further embodiment of the substrate holding case in accordance with the present invention.

FIG. 11 depicts a still further embodiment of a case for accommodating a substrate 5 with a specific size. In this embodiment, each of the top cover 2 and the bottom cover 3 includes only a single set of protrusions.

By the adoption of the above-described constitution, the case of the present invention is capable of stably holding a substrate such as a photomask or a blank to be accommodated, is low in dust generating characteristics due to vibration which may be caused at the time of storage or delivery of the substrates, and has a simple structure. The case of the present invention is capable of accommodating various substrates having different thicknesses and sizes, and it is also easy to hold a photomask having a pellicle.

What is claimed is:

1. A substrate holding case for holding a substrate of a quadrangular plate shape having opposite major surfaces and four side edges, comprising:
   a case body including a top cover and a bottom cover, said top and bottom covers each having an inner surface, each inner surface opposing the other;
   substrate holding means adapted for holding a substrate inside the case body with its major surfaces in confronting relation with said inner surfaces of the top and bottom covers, respectively, said substrate holding means comprising a plurality of holding protrusions extending from each of said inner surfaces toward respective confronting major surfaces of a held substrate, and caps replaceably fitted on at least some of said protrusions, each of said caps being made of an elastic material and having a round tip adapted for abutting contact with its associated major surface of a held substrate; and
   substrate positioning means provided on at least one of said inner surfaces, said substrate positioning means comprising projections extending toward a held substrate inside the case body and being disposed for abutment with the four side edges of a held substrate so as to position the substrate with respect to directions along the major surfaces of the substrate.

2. A substrate holding case according to claim 1, wherein said elastic material of the caps comprises silicone resin.

3. A substrate holding case according to claim 1, wherein said holding protrusions are integrally formed with said top cover and said bottom cover.

4. A substrate holding case according to claim 1, wherein said projections are integrally formed with at least one of said top cover and said bottom cover.

5. A substrate holding case according to claim 1, wherein said top cover and bottom cover include on outside surfaces thereof top engaging means for stacking and bottom engaging means for stacking, respectively, said top and bottom engaging means being shaped to be engageable with bottom and top engaging means, respectively, or similar substrate holding cases stacked, above and below said case, respectively.

6. A substrate holding case according to claim 1, wherein said case body comprises a hard synthetic resin containing low electric resistivity rubber particles dispersed therein.

7. A substrate holding case according to claim 1, further comprising fastening means for fastening said top and bottom covers together.

8. A substrate holding case according to claim 7, wherein the case is of a quadrangular box shape having four corners, and said fastening means comprises a band fitted on each of said corners.

9. A substrate holding case according to claim 1, wherein said top and bottom covers are detachably fitted on each other to allow separation therebetween.

10. A substrate holding case according to claim 1, wherein said caps fitted on said holding protrusions extending from said top cover have a different dimension in the direction toward the associated major surface of a held substrate, compared to said caps fitted on said protrusions extending from said bottom cover.

11. A substrate holding case according to claim 1, wherein said holding protrusions extending from the two inner surfaces of said covers are in alignment.

12. A substrate holding case for holding a substrate of a rectangular plate shape having opposite major surfaces, four corners and four side edges, comprising:
   a case body including a top cover and a bottom cover, said top and bottom covers each having an inner surface, each inner surface opposing the other substrate holding means adapted for holding a substrate inside the case body with its major surfaces in confronting relation with said inner surfaces of the top and bottom covers, respectively, said substrate holding means comprising a plurality of holding protrusions extending from each of said inner surfaces toward respective confronting major surfaces of a held substrate, said protrusions including first protrusions disposed in a rectangular configuration on each of said inner surfaces of the covers, said first protrusions being positioned at the four corners of the rectangular configuration, and second protrusions disposed at positions adjacent to, and displaced toward the center of the rectangular configuration from said first protrusions;
   substrate positioning means provided on at least one of said inner surfaces, said substrate positioning means comprising positioning projections extending toward a held substrate inside the case body and being disposed for abutment with said four side edges of a held substrate so as to position the substrate with respect to directions along the major surfaces of the substrate; and
   said projections being provided in pairs, each of the pairs being disposed on two adjoining side edges adjacent to each corner of the rectangular configuration, each of said projections of each pair being of an angled shaped having a first portion extending along the associated side edge of the rectangular configuration and a second portion integrally extending angularly from the first portion in a direction away from the associated side edge of the rectangular configuration and parallel to a diagonal line, subtending each corner of the rectangular configuration, said first portion being adapted to abut a side edge of a first substrate corresponding in size and orientation to said rectangular configuration, said second portion being adapted to abut a side edge of a second substrate of a size different from a said first substrate and of an orientation turned, in the plane of a held substrate, by 45° relative to the orientation of a held first substrate.

13. A substrate holding case according to claim 12, wherein said substrate holding means further comprises caps detachably fitted on either said first or second protrusions, each of said caps being made of an elastic material and having a tip adapted for abutting contact with its associated major surface of a held substrate.

14. A substrate holding case according to claim 13, wherein said elastic material of the caps comprises silicone resin.

15. A substrate holding case according to claim 13, wherein said caps fitted on said holding protrusions extending from said top cover have a different dimension in the direction toward the associated major surface of a held substrate, compared to said caps fitted on said protrusions extending from said bottom cover.

16. A substrate holding case according to claim 13, wherein said holding protrusions extending from the two inner surfaces of said covers are in alignment.

17. A substrate holding case according to claim 12, wherein said case body is of a rectangular box shape having four corners and four sides each extending parallel to the adjacent second portion of each projection.

18. A substrate holding case according to claim 17, further comprising holding protrusions extending from the top and bottom covers toward the associated major surfaces of a held substrate, adjacent to said four corners of the case body.

19. A substrate holding case according to claim 12, wherein said holding protrusions are integrally formed with said top cover and said bottom cover.

20. A substrate holding case according to claim 12, wherein said projections are integrally formed with at least one of said top cover and said bottom cover.

21. A substrate holding case according to claim 12, wherein said top cover and bottom cover include on outside surfaces thereof top engaging means for stacking and bottom engaging means for stacking, respectively, said top and bottom engaging means being shaped to be engageable with bottom and top engaging means, respectively, of similar substrate holding case stacked above and below said case, respectively.

22. A substrate holding case according to claim 12, wherein said case body is made of a hard synthetic resin containing low electric resistivity rubber particles dispersed therein.

23. A substrate holding case according to claim 12, further comprising fastening means for fastening said top and bottom covers together.

24. A substrate holding case according to claim 23, wherein the case is of a quadrangular box shape having four corners, and said fastening means comprises a band fitted on each of said corners.

25. A substrate holding case according to claim 12, wherein said top and bottom covers are detachably fitted to each other to allow separation therebetween.

* * * * *